US006187677B1

(12) United States Patent
Ahn

(10) Patent No.: US 6,187,677 B1
(45) Date of Patent: Feb. 13, 2001

(54) INTEGRATED CIRCUITRY AND METHODS OF FORMING INTEGRATED CIRCUITRY

(75) Inventor: Kie Y. Ahn, Chappaqua, NY (US)

(73) Assignee: Micron Technology, Inc., Boise, ID (US)

(*) Notice: Under 35 U.S.C. 154(b), the term of this patent shall be extended for 0 days.

(21) Appl. No.: 08/917,443

(22) Filed: Aug. 22, 1997

(51) Int. Cl.$^7$ .................................................. H01L 21/44
(52) U.S. Cl. ...................... 438/667; 438/928; 438/660; 438/718
(58) Field of Search .................... 438/667, 719, 438/658, 660, 928

(56) References Cited

U.S. PATENT DOCUMENTS

| 3,982,268 | 9/1976 | Anthony et al. ............... 357/55 |
| 4,394,712 | * 7/1983 | Anthony . |

(List continued on next page.)

FOREIGN PATENT DOCUMENTS 4-133472    5/1992   (JP) .

OTHER PUBLICATIONS

U.S. application No. 08/917,003, Ahn, filed Aug. 27, 1997.
U.S. application No. 09/095,774, Ahn, filed Jun. 10, 1998.
U.S. application No. 09/118,346, Geusic et al., filed Jul. 17, 1998.
*Low and High Dielectric Constant Thin Films for Integrated Circuit Application*, R. J. Gutmann, et al., Oct. 3–5, 1996, 6 pgs.

U.S. application No. 08/917,449, Geusic et al., filed Aug. 22, 1997.

Lehmann, V., "The Physics of Macropore Formation in Low Doped n–Type Silicon," *J. Electrochem. Soc.,* vol. 140, No. 10, Oct. 1993, pp. 2836–2843.

(List continued on next page.)

*Primary Examiner*—Caridad Everhart
(74) *Attorney, Agent, or Firm*—Wells, St. John, Roberts, Gregory & Matkin P.S.

(57) ABSTRACT

Integrated circuitry and methods of forming integrated circuitry are described. In one aspect, a hole is formed in a semiconductor wafer. In a preferred implementation, the hole extends through the entire wafer. Subsequently, conductive material is formed within the hole and interconnects with integrated circuitry which is formed proximate at least one of a front and back wafer surface. According to one aspect of the invention, integrated circuitry is formed proximate both front and back surfaces. In a preferred implementation, a plurality of holes are formed through the wafer prior to formation of the integrated circuitry. In accordance with a preferred implementation, formation of the conductive material within the hole takes place through formation of a first material within the hole. A second material is formed over the first material, with at least the second material being electrically conductive. The wafer is exposed to conditions which are effective to cause the second material to replace the first material. In another preferred implementation, the hole has an interior surface and prior to formation of the conductive material therein, a dielectric layer is formed within the hole proximate the interior surface.

35 Claims, 4 Drawing Sheets

U.S. PATENT DOCUMENTS

| | | |
|---|---|---|
| 4,419,150 | 12/1983 | Soclof . |
| 4,440,973 | 4/1984 | Hawkins . |
| 4,595,428 * | 6/1986 | Anthony et al. . |
| 4,610,077 | 9/1986 | Minahan et al. ............ 29/572 |
| 4,776,087 | 10/1988 | Cronin et al. . |
| 4,870,470 | 9/1989 | Bass, Jr. et al. ............ 357/23.5 |
| 4,933,743 | 6/1990 | Thomas et al. ............ 357/71 |
| 4,939,568 | 7/1990 | Kato et al. ............ 357/75 |
| 4,977,439 | 12/1990 | Esquivel et al. ............ 359/49 |
| 5,148,260 | 9/1992 | Inoue et al. . |
| 5,166,097 | 11/1992 | Tanielian ............ 437/203 |
| 5,312,765 | 5/1994 | Kanber . |
| 5,317,197 | 5/1994 | Roberts ............ 257/401 |
| 5,424,245 | 6/1995 | Gurtler et al. . |
| 5,426,072 | 6/1995 | Finnila ............ 437/208 |
| 5,482,873 | 1/1996 | Yang ............ 437/31 |
| 5,539,227 | 7/1996 | Nakano . |
| 5,539,256 | 7/1996 | Mikagi . |
| 5,587,119 | 12/1996 | White ............ 264/104 |
| 5,596,230 | 1/1997 | Hong . |
| 5,599,744 | 2/1997 | Koh et al. ............ 437/195 |
| 5,608,237 | 3/1997 | Aizawa et al. . |
| 5,614,743 | 3/1997 | Mochizuki . |
| 5,618,752 * | 4/1997 | Gaul . |
| 5,635,423 | 6/1997 | Huang et al. . |
| 5,640,049 | 6/1997 | Rostoker et al. ............ 257/758 |
| 5,646,067 * | 7/1997 | Gaul . |
| 5,661,344 | 8/1997 | Havemann et al. . |
| 5,682,062 | 10/1997 | Gaul ............ 257/686 |
| 5,698,867 | 12/1997 | Bauer et al. . |
| 5,699,291 | 12/1997 | Tsunemine ............ 365/149 |
| 5,717,247 | 2/1998 | Koh et al. ............ 257/686 |
| 5,750,436 | 5/1998 | Yamaga et al. . |
| 5,753,529 * | 5/1998 | Chang et al. . |
| 5,767,001 | 6/1998 | Bertagnolli et al. ............ 438/455 |
| 5,807,783 | 9/1998 | Gaul et al. ............ 438/406 |
| 5,811,868 | 9/1998 | Bertin et al. ............ 257/516 |
| 5,817,572 | 10/1998 | Chiang et al. . |
| 5,827,775 | 10/1998 | Miles et al. . |
| 5,841,197 | 11/1998 | Adamic, Jr. . |
| 5,852,320 | 12/1998 | Ichihashi ............ 257/419 |
| 5,858,877 | 1/1999 | Dennison et al. . |
| 5,869,893 | 2/1999 | Koseki et al. . |
| 5,930,625 | 7/1999 | Lin et al. . |
| 5,933,758 | 8/1999 | Jain . |
| 5,990,562 | 11/1999 | Vallett . |
| 6,001,538 | 12/1999 | Chen et al. . |
| 6,037,244 | 3/2000 | Gardner et al. . |
| 6,037,248 | 3/2000 | Ahn . |

OTHER PUBLICATIONS

Horie, H., et al., "Novel High Aspect Ratio Plug for Logic/DRAM LSIs Using Polysilicon–Aluminum Substitute (PAS)," *Technical Digest of International Electron Devices Meeting,* Dec. 8–11, 1996, pp. 946–948.

Muller, K.P., et al., "Trench Storage Node Technology for Gigabit DRAM Generations," *Technical Digest of International Electron Devices Meeting,* Dec. 8–11, 1996, pp. 507–510.

Sekine et al., "A New High–Density Plasma Etching System Using a Dipole–Ring Magnet", Jpn. J. Appl. Phys. Nov. 1995, Pt. I, No. 11.

Evaluation on Selective Deposition of CVD W Films by Measurement of Surface Temperature, T. Ohba, Y. Ohyama, S. Inoue, & M. Maeda, 1987 Materials & Research Society, 8 pgs. No Month.

VLSI Multilevel Micro–Coaxial Interconnects for High Speed Devices, M.E. Thomas, I.A. Saadat & Sekigahama, IEEE 1990, pgs. 90–55—90–58.

Selective Chemical Vapor Deposition of Tungsten Using Silane and Polysilane Reductions, T. Ohba, T. Suzuki, T. Hara, Y. Furumura & K. Wada, 1989 Materials Research Society, 9 pgs.

High Rate Low–Temperature Selective Tungsten, R.F. Foster, S. Tseng, L. Lane & K.Y. Ahn, 1988 Materials Research Society, 4 pgs.

* cited by examiner

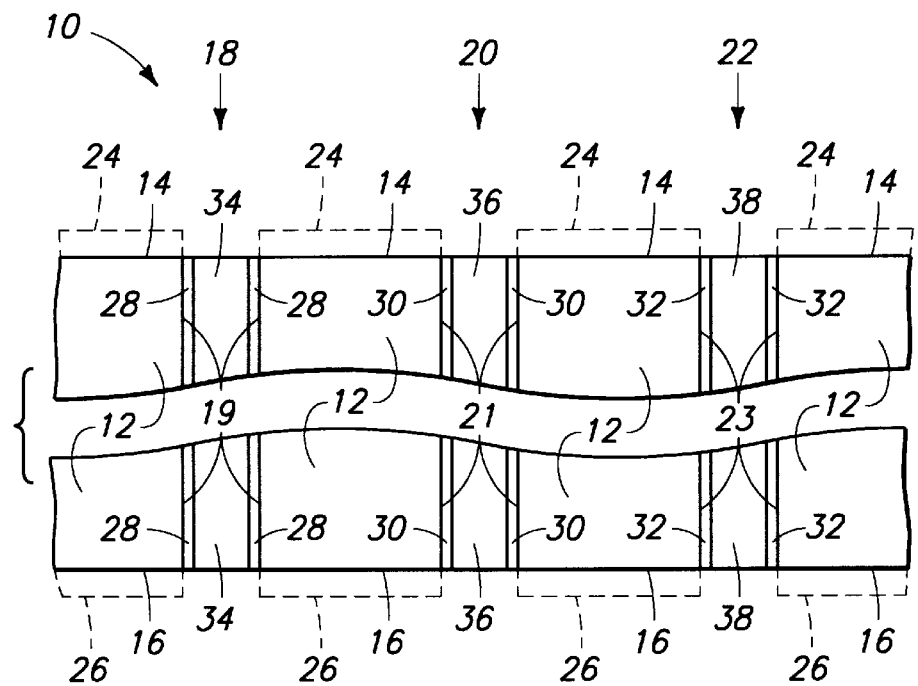
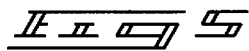
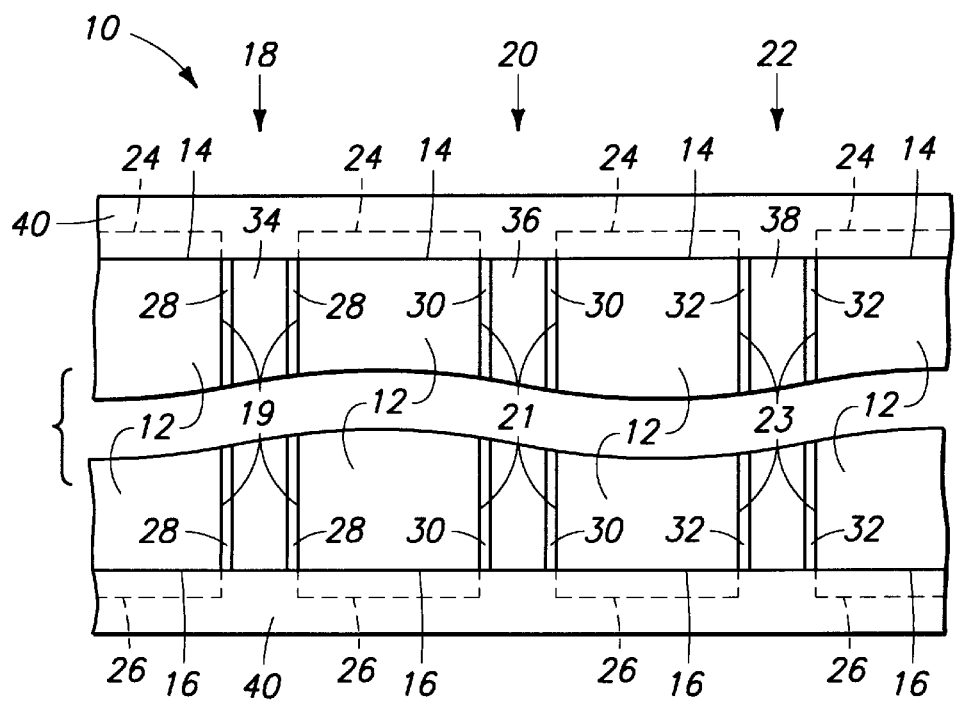
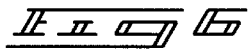

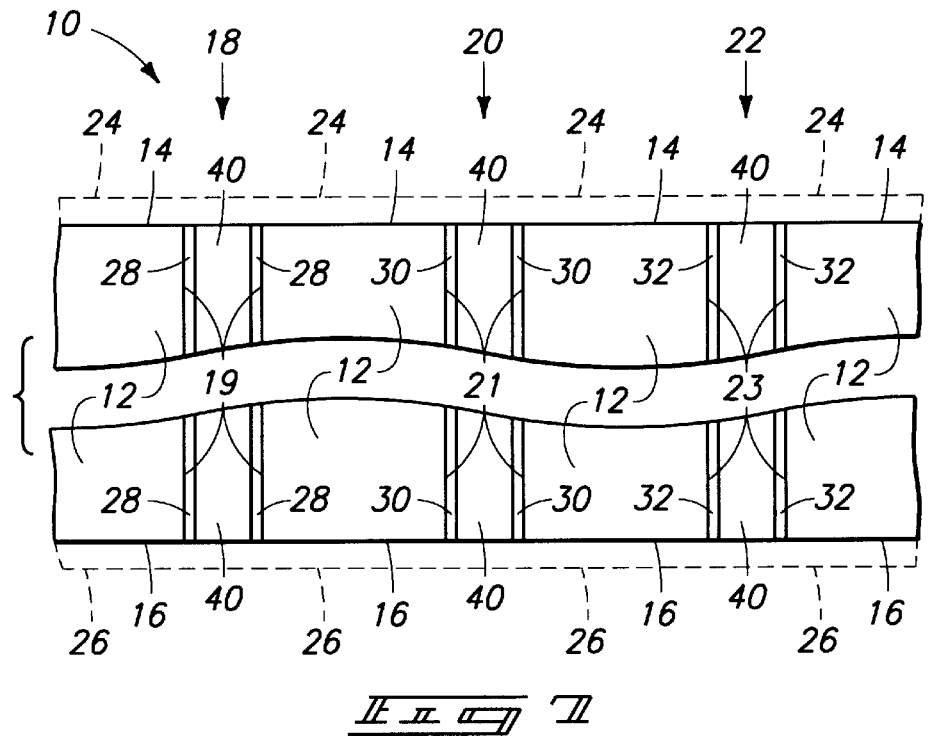
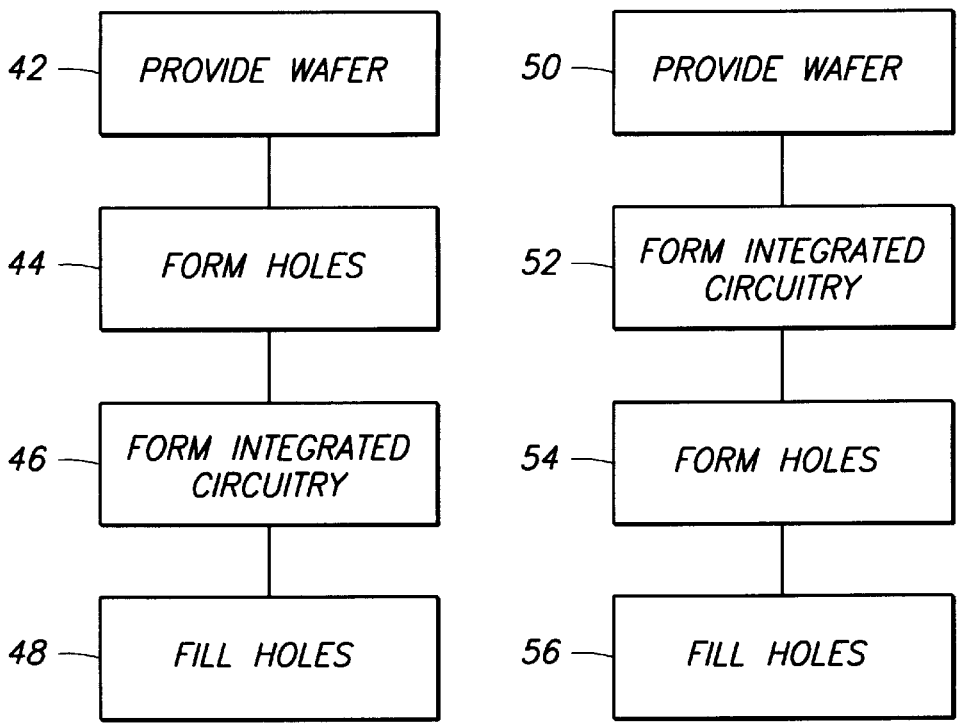

INTEGRATED CIRCUITRY AND METHODS OF FORMING INTEGRATED CIRCUITRY

TECHNICAL FIELD

This invention relates to integrated circuitry and methods of forming integrated circuitry.

BACKGROUND OF THE INVENTION

As integrated circuitry dimensions shrink, a continuing challenge in the semiconductor industry is to find new, innovative, and efficient ways of forming electrical connections with and between circuit devices which are fabricated on the same and on different wafers or dies. Relatedly, continuing challenges are posed to find and/or improve upon the packaging techniques utilized to package integrated circuitry devices.

This invention arose out of concerns associated with improving the manner in which electrical connections or interconnections are formed relative to integrated circuitry devices.

SUMMARY OF THE INVENTION

Integrated circuitry and methods of forming integrated circuitry are described. In one aspect, a hole is formed in a semiconductor wafer. In a preferred implementation, the hole extends through the entire wafer. Subsequently, conductive material is formed within the hole and interconnects with integrated circuitry which is formed proximate at least one of a front and back wafer surface. According to one aspect of the invention, integrated circuitry is formed proximate both front and back surfaces. In a preferred implementation, a plurality of holes are formed through the wafer prior to formation of the integrated circuitry.

In accordance with a preferred implementation, formation of the conductive material within the hole takes place through formation of a first material within the hole. A second material is formed over the first material, with at least the second material being electrically conductive. The wafer is exposed to conditions which are effective to cause the second material to replace the first material. In another preferred implementation, the hole has an interior surface and prior to formation of the conductive material therein, a dielectric layer is formed within the hole proximate the interior surface.

BRIEF DESCRIPTION OF THE DRAWINGS

Preferred embodiments of the invention are 'described below with reference to the following accompanying drawings.

FIG. 5 is a cross-sectional view of the FIG. 1 semiconductor wafer fragment at processing step subsequent to that shown by FIG. 4.

FIG. 6 is a cross-sectional view of the FIG. 1 semiconductor wafer fragment at a processing step subsequent to that shown by FIG. 5.

FIG. 7 is a cross-sectional view of the FIG. 1 semiconductor wafer fragment at a processing step subsequent to that shown by FIG. 6.

FIG. 8 shows, in flow diagram form, various methodical aspects of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
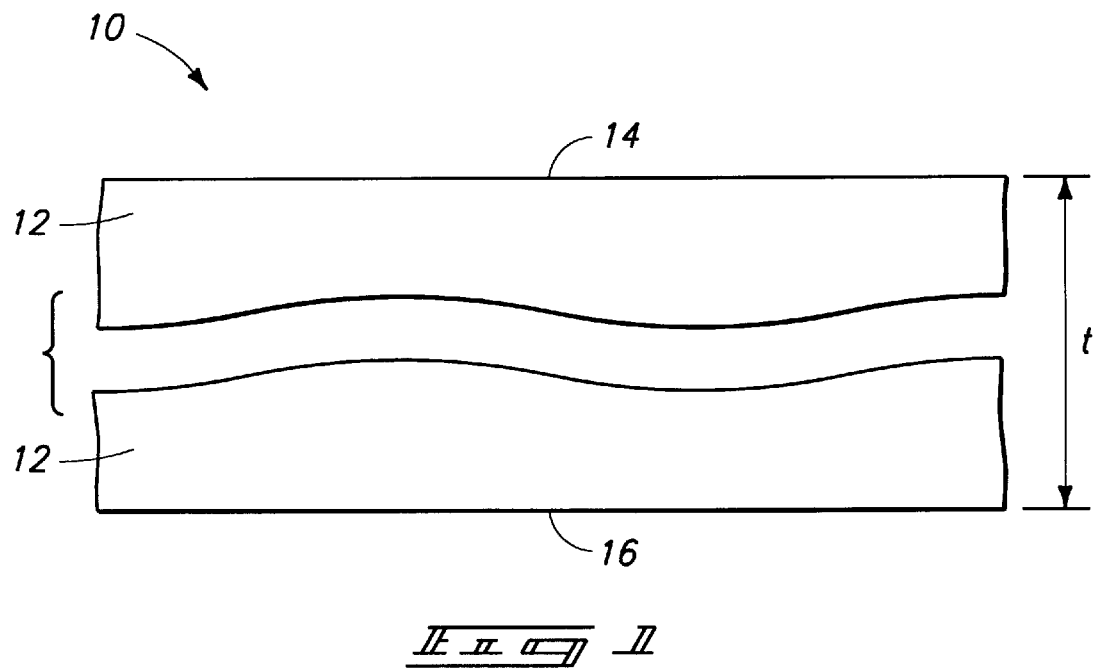
FIG. 1 is a cross-sectional view of a semiconductor wafer fragment at one processing step in accordance with the invention.

Referring to FIG. 1, a semiconductor wafer fragment is indicated generally at 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure such as dies and the like, including, but not limited to, the semiconductive substrates described above. Wafer fragment 10 includes a front surface 14 and a back surface 16 and a wafer thickness t which is defined between the surfaces. An exemplary wafer thickness is around 30 mils or between around 750–800 $\mu$m.

Figure 2:
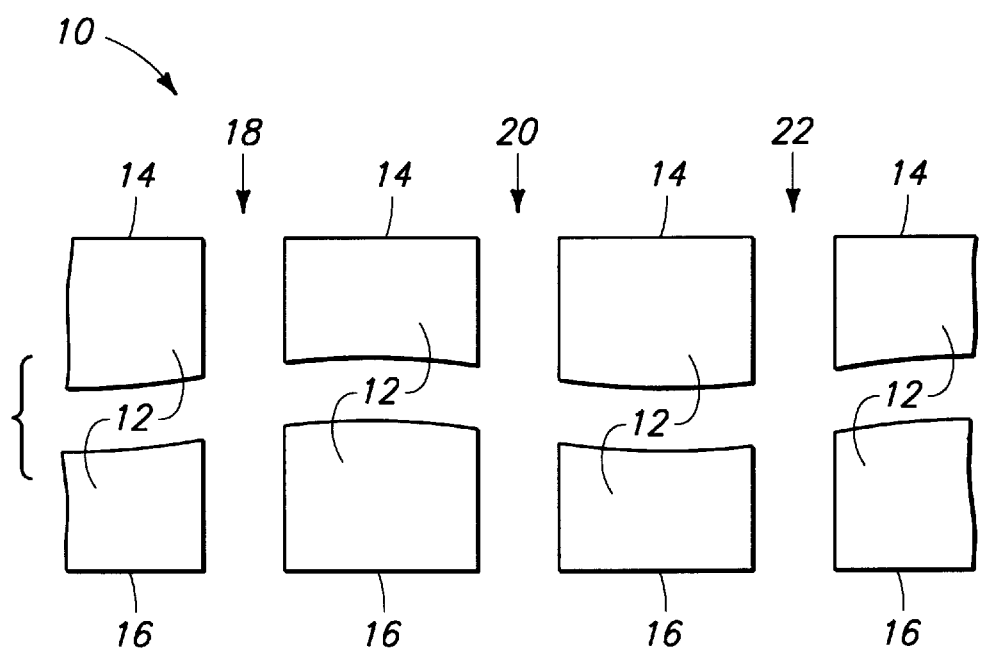
FIG. 2 is a cross-sectional view of the FIG. 1 semiconductor wafer fragment at a processing step subsequent to that shown by FIG. 1.

Referring to FIG. 2, amounts of semiconductive wafer material are removed to form holes or passageways 18, 20, and 22. In one aspect, such holes are formed to a depth of not less than ½ of thickness t. In a preferred aspect, holes 18, 20, and 22 extend perpendicularly through the entirety of wafer fragment 12 and join with front and back surfaces 14, 16. Preferably, holes 18, 20, and 22 have aspect ratios greater than about 50. Even more preferably, such holes have aspect ratios between about 75 and 80.

In a preferred implementation, holes 18, 20, and 22 are formed or otherwise provided prior to processing of any integrated circuitry devices over either of surfaces 14, 16. That is, prior to patterning any conductive material which is associated with integrated circuitry devices to be formed over either of surfaces 14, 16, holes 18, 20, and 22 are formed. Such holes can be formed through suitable etching techniques. Alternatively, such holes can be formed or drilled with a suitable laser. In a preferred aspect, very high aspect ratio holes are formed by placing the wafer in a semiconductor wafer processor comprising a dipole-ring magnetron etching reactor. Thereafter, wafer 10 is exposed to conditions within the dipole-ring magnetron etching reactor which are sufficient to form holes which extend through the entirety of the wafer. A suitable dipole-ring magnetron (DRM) reactor is described in an article entitled "Trench Storage Node Technology for Gigabit DRAM Generations", Technical Digest of International Electron Devices Meeting, Dec. 8–11, 1996, pps. 507–510, published by IEEE, Catalog No. 96CH35961 and authored by Muller et al. Additionally, a suitable DRM system and exemplary processing conditions are described in an article entitled "A New High-Density Plasma Etching System Using A Dipole-Ring Magnet", Jpn. J. Appl. Phys., Vol. 34, Pt. 1, No. 11, November 1995, pps. 6274–6278, and authored by Sekine et al. After formation of holes 18, 20, and 22, such can be temporarily filled with a material such as photoresist to enable subsequent processing of integrated circuitry devices over either or both of surfaces 14, 16.

Figure 3:
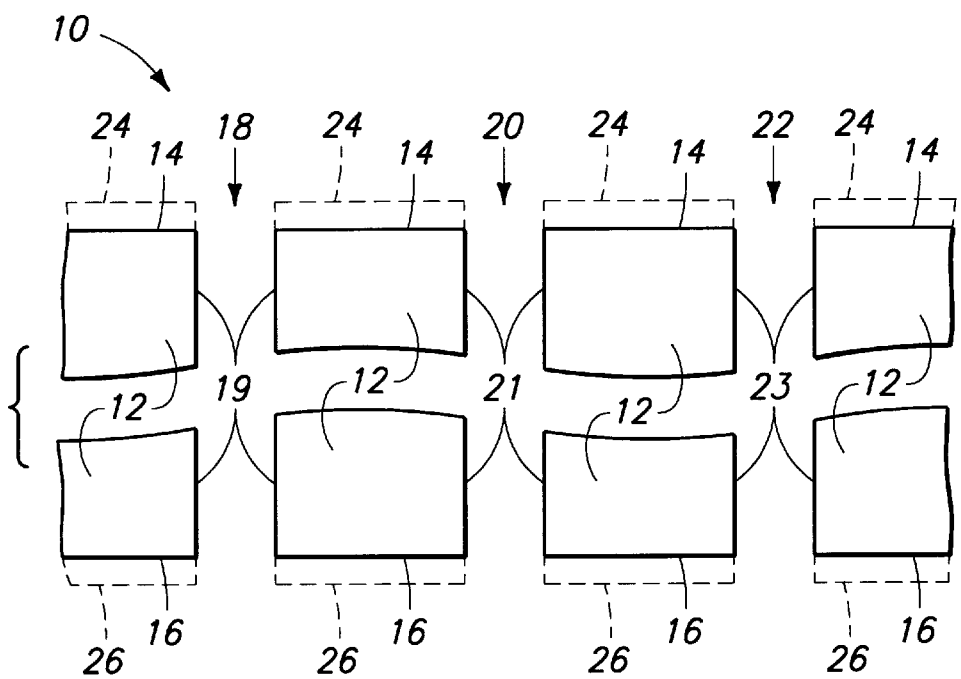
FIG. 3 is a cross-sectional view of the FIG. 1 semiconductor wafer fragment at a processing step subsequent to that shown by FIG. 2.

Referring to FIG. 3, and in accordance with a preferred implementation, integrated circuitry is formed or otherwise processed and supported by wafer fragment 10. Integrated circuitry 24 can be formed over or proximate front surface 14, back surface 16, or both of front and back surfaces 14, 16, respectively.

Figure 4:
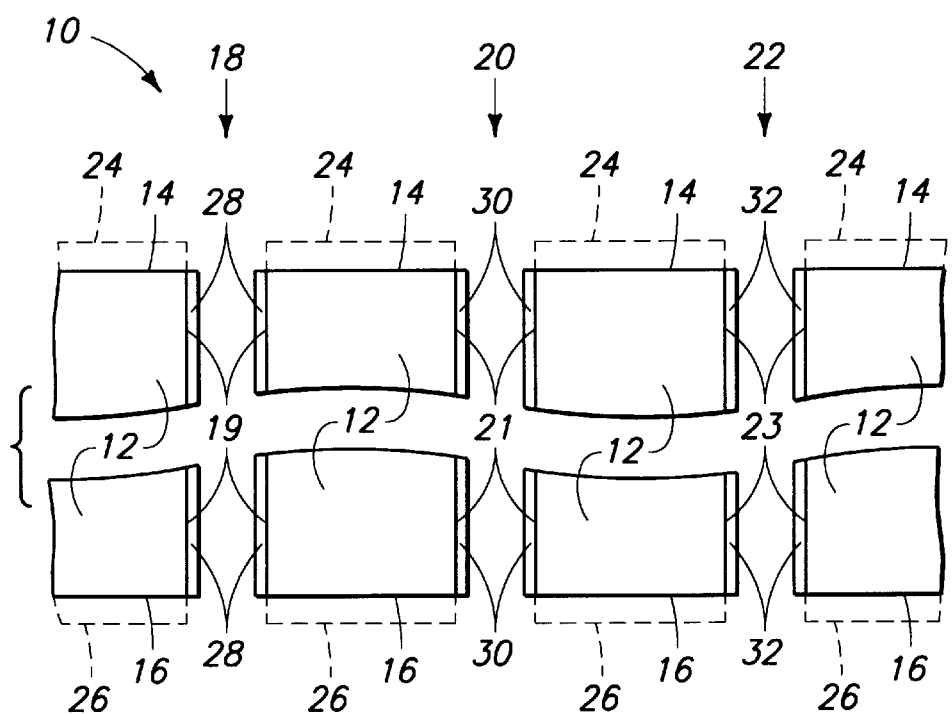
FIG. 4 is a cross-sectional view of the FIG. 1 semiconductor wafer fragment at a processing step subsequent to that shown by FIG. 3.

Referring to FIG. 4, wafer fragment 10 is exposed to conditions which are effective to form respective dielectric layers 28, 30, and 32 within each of holes 18, 20, and 22 and proximate the respective interior surfaces 19, 21, and 23 thereof. In one aspect, dielectric layers 28, 30, and 32 comprise a nitride-containing layer which is disposed proximate respective interior surfaces 19, 21, and 23. An oxide-containing layer is formed over the nitride-containing layer to provide a dielectric NO layer within the hole. In a preferred implementation, a nitride-containing layer is formed through chemical vapor deposition, and the oxide layer by exposing the substrate to oxidizing conditions. In a preferred implementation, dielectric layers 28, 30, and 32 constitute reoxidized LPCVD nitride film which forms the illustrated and preferred NO dielectric layer. An exemplary processing implementation includes in-situ nitridation in ammonia at 950° C. Low pressure chemical vapor deposition of nitride at 700° C. takes place with dichlorosilane and ammonia. Subsequently, reoxidation of the nitride takes place at a temperature of between 900° C. to 950° C. Alternatively, fast thermal processing (FTP) can implement the above-described three processing steps into a single processing run. Exemplary processing methods and systems are described in the Muller et al. article referenced above. Alternatively, dielectric layers 28, 30, and 32 can comprise a thin silicon dioxide film. A desired and exemplary thickness of such layers is between about 50–100 nanometers.

Referring to FIG. 5, electrical interconnect material 34, 36 and 38 is formed within holes 18, 20, and 22 respectively. Such material preferably fills each hole and is capable of electrically interconnecting integrated circuitry formed over both front and back surfaces 14, 16 respectively. In a preferred implementation, interconnect material 34, 36, and 38 constitutes a first material which is formed within each respective hole and comprises polysilicon which is formed through chemical vapor deposition. Excess first material can be removed through conventional techniques to provide the FIG. 5 construction. Exemplary techniques include planarization and/or various etching techniques.

Referring to FIG. 6, a second layer of electrically conductive material 40 is formed over first material 34, 36, and 38. Preferably, such material is formed over both front and back surfaces 14, 16. In another aspect, second material 40 constitutes a layer comprising a metal material which is different from first material 34, 36, and 38. In a preferred aspect, second material 40 constitutes an aluminum-comprising layer or film. Such material or film can be deposited through suitable sputtering or evaporation techniques. Mechanical masks can be utilized in order to define with more particularity the area over which the preferred aluminum layer is deposited. Alternatively, such layer can be blanket deposited and subsequently processed as described below.

Referring to FIG. 7, wafer fragment 10 is exposed to processing conditions which are effective to cause second material 40 to replace first material 34, 36, and 38 (FIG. 6). Preferably, the first material is completely replaced with the second material and the second material electrically interconnects at least some of the front surface integrated circuitry 24 with at least some back surface integrated circuitry 26. Exemplary processing conditions include annealing the wafer at a temperature greater than or equal to about 500° C. for a sufficient amount of time. The thickness of the second material 40 (FIG. 6) will be determined by the size and dimensions of the interconnecting hole or passageway. As a guideline, and for a 0.175 micron diameter and 1.7 micron deep hole with an aspect ratio of 10, an aluminum thickness of 0.5 microns is sufficient to substitute the preferred polysilicon. Annealing times and temperatures can be decreased by forming a thin, e.g., 0.2 μm, Ti layer over material 40 prior to annealing (not specifically shown). The Ti layer acts as a polysilicon capture layer which accelerates the replacement of polysilicon with aluminum. Exemplary processing methods are described in an article entitled "Novel High Aspect Ratio Plug for Logic/DRAM LSIs Using Polysilicon-Aluminum Substitute (PAS)", Technical Digest of International Electron Devices Meeting, Dec. 8–11, 1996, pps. 946–8, published by IEEE, Catalog No. 96CH35961 and authored by Horie et al. Excess aluminum and the substituted-for polysilicon can be removed through suitable processing techniques such as chemical mechanical polishing.

Alternately considered, a conductive interconnect is provided within wafer fragment 10 between and electrically connecting at least a portion of the front-formed integrated circuitry and the back-formed integrated circuitry. In the illustrated example, the integrated circuitry is formed in advance of the formation of the conductive interconnect.

Referring to FIG. 8, certain methodical aspects of the invention are shown at 40 in the form of a flow diagram. A semiconductor wafer is provided at 42, and holes are formed at 44, preferably in a manner described above. Following formation of the holes at 44, integrated circuitry is formed at 46 over the wafer. After formation of the integrated circuitry, the holes are filled at 48 with electrically conductive interconnect material which interconnects with the integrated circuitry.

In another implementation, a wafer is provided at 50, and integrated circuitry is formed at 52. After formation of the integrated circuitry, holes are formed in accordance with the above-described methodology. Thereafter, such holes are filled with conductive interconnect material in a manner which interconnects with the integrated circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of processing a semiconductor wafer comprising:

placing a wafer in a semiconductor wafer processor;
forming a hole which extends through the entire wafer within the semiconductor wafer processor; and
forming conductive material within the hole by:
 forming a first material within the hole;
 forming a second material over the first material, at least the second material being electrically conductive; and exposing the wafer to conditions which are effective to cause the second material to replace the first material.

2. The method of claim 1, wherein the semiconductor wafer processor comprises a dipole-ring magnetron etching reactor.

3. The method of claim 1, wherein the hole has an aspect ratio of no less than about 70.

4. The method of claim 1, wherein the semiconductor wafer has a front and a back surface, and the hole extends generally perpendicularly relative to at least one of the surfaces.

5. The method of claim 1, wherein:
the forming of the first material comprises chemical vapor depositing polysilicon within the hole; and
the forming of the second material comprises forming a metal-comprising layer over the first material.

6. The method of claim 1, wherein the hole has an interior surface, and further comprising prior to the forming of the conductive material, forming a dielectric layer within the hole and proximate the interior surface.

7. A method of processing a semiconductor wafer comprising:
placing a wafer in a semiconductor wafer processor;
forming a hole which extends through the entire wafer within the semiconductor wafer processor, wherein the hole has an interior surface;
forming a dielectric layer within the hole and proximate the interior surface by:
chemical vapor depositing a nitride-containing layer proximate the interior surface; and
exposing the wafer to oxidizing conditions which are effective to oxidize at least a portion of the nitride-containing layer; and
after forming the dielectric layer, forming conductive material within the hole.

8. A method of forming integrated circuitry comprising:
providing a semiconductor wafer having front and back surfaces;
forming a hole through the wafer which extends between the front and back surfaces, wherein the hole defines an interior surface which extends between the front and back surfaces;
fabricating integrated circuitry proximate at least one of the front and back surfaces;
exposing the wafer to conditions which are effective to form a dielectric material layer proximate the interior surface, wherein the exposing of the wafer comprises:
forming a nitride-containing layer proximate the interior surface; and
forming an oxide-containing layer over the nitride-containing layer; and
after said exposing, filling the hole with conductive material to interconnect with the integrated circuitry.

9. The method of claim 8, wherein the exposing of the wafer comprises chemical vapor depositing the nitride-containing layer over the interior surface.

10. A method of forming integrated circuitry comprising:
providing a semiconductor wafer having front and back surfaces;
forming a hole through the wafer which extends between the front and back surfaces;
fabricating integrated circuitry proximate at least one of the front and back surfaces; and
filling the hole with conductive material to interconnect with the integrated circuitry, wherein the filling of the hole comprises:
forming polysilicon within the hole;
forming a metal-comprising layer over the polysilicon layer;
subjecting the wafer to conditions which are effective to cause material of the metal-comprising layer to replace material of the polysilicon layer.

11. The method of claim 10, wherein the subjecting of the wafer comprises exposing the wafer to temperature conditions greater than or equal to about 500° C. for a sufficient duration of time.

12. A method of forming integrated circuitry comprising:
providing a semiconductor wafer having front and back surfaces;
forming a hole through the wafer which extends between the front and back surfaces, wherein the hole defines an interior surface which extends between the front and back surfaces;
fabricating integrated circuitry proximate at least one of the front and back surfaces;
exposing the wafer to conditions which are effective to form a dielectric material layer proximate the interior surface; and
after the exposing of the wafer, filling the hole with conductive material to interconnect with the integrated circuitry;
wherein the exposing of the wafer comprises:
chemical vapor depositing a nitride-containing layer over the interior surface and
oxidizing at least a portion of the nitride-containing layer; and further wherein the filling of the hole comprises:
forming polysilicon within the hole;
forming an aluminum-containing layer over the polysilicon layer; and
subjecting the wafer to conditions which are effective to cause material of the aluminum-containing layer to replace material of the polysilicon layer.

13. A method of forming integrated circuitry comprising:
providing a semiconductor wafer having front and back surfaces;
forming integrated circuitry proximate both the front and back surfaces;
forming a conductive interconnect within the wafer between and electrically connecting at least a portion of the front formed integrated circuitry and the back formed integrated circuitry; and
wherein the forming of the integrated circuitry takes place in advance of the forming of the conductive interconnect.

14. A method of forming integrated circuitry comprising:
providing a semiconductor wafer having front and back surfaces;
forming integrated circuitry proximate both the front and back surfaces; and
forming a conductive interconnect within the wafer between and electrically connecting at least a portion of the front formed integrated circuitry and the back formed integrated circuitry, wherein the forming of the conductive interconnect comprises:
forming a hole which extends between and joins with the it front and back surfaces;
forming a first material within the hole;
forming a second material over the first material, at least the second material being electrically conductive; and exposing the wafer to conditions which are effective to cause the second material to replace the first material.

15. The method of claim 14, wherein the forming of the hole comprises forming the hole to extend generally perpendicularly relative to at least one of the front and back surfaces.

16. The method of claim 14, wherein the first and second materials are different from one another.

17. The method of claim 14, wherein the first material comprises polysilicon and the second material comprises an aluminum-comprising material.

18. The method of claim 14 further comprising prior to forming the first material, forming a dielectric material layer within the hole.

19. The method of claim 14, wherein the forming of the hole comprises etching the hole in the wafer.

20. A method of forming integrated circuitry comprising:
providing a semiconductor wafer having front and back surfaces;
forming integrated circuitry over both the front and back surfaces;
forming a hole through the wafer which extends between the front and back surfaces; and
electrically interconnecting front-surface integrated circuitry and back-surface integrated circuitry through the hole, wherein the electrically interconnecting of the front-surface integrated circuitry and the back-surface integrated circuitry comprises:
    filling at least a portion of the hole with a first material;
    forming a conductive second material over the first material, the second material being different from the first material; and
    exposing the wafer to conditions which are effective to cause at least some of the second material to replace at least some of the first material.

21. The method of claim 20, wherein the hole is completely filled with first material, and the first material is completely replaced with second material.

22. The method of claim 20, wherein the first material comprises polysilicon and the second material comprises a metal-comprising material.

23. The method of claim 20, wherein the exposing of the wafer comprises annealing the wafer at a temperature and for a time which is sufficient to cause the second material to replace the first material.

24. A method of forming integrated circuitry comprising:
providing a semiconductor wafer having front and back surfaces;
forming integrated circuitry over both the front and back surfaces;
forming a hole through the wafer which extends between the front and back surfaces; and
electrically interconnecting front-surface integrated circuitry and back-surface integrated circuitry through the hole, wherein the electrically interconnecting of the front-surface integrated circuitry and the back surface integrated circuitry comprises:
chemical vapor depositing polysilicon within the hole to at least substantially fill the hole;
forming a metal-comprising material layer over the polysilicon; and
annealing the wafer at a temperature, and for a duration of time which is sufficient to cause the metal-comprising material to replace at least a substantial portion of the polysilicon within the hole.

25. A method of forming integrated circuitry comprising:
providing a semiconductor wafer having front and back surfaces;
forming integrated circuitry over both the front and back surfaces;
forming a hole through the wafer which extends between the front and back surfaces; and
electrically interconnecting front-surface integrated circuitry and back-surface integrated circuitry through the hole, and further comprising after the forming of the hole and prior to the electrically interconnecting, forming a dielectric material layer within the hole by forming a nitride-containing dielectric material layer within the hole.

26. A method of forming integrated circuitry comprising:
providing a semiconductor wafer having front and back surfaces;
forming integrated circuitry over both the front and back surfaces;
forming a hole through the wafer which extends between the front and back surfaces; and
electrically interconnecting front-surface integrated circuitry and back-surface integrated circuitry through the hole, and further comprising after the forming of the hole and prior to the electrically interconnecting, forming a dielectric material layer within the hole by:
    chemical vapor depositing a nitride-containing layer within the hole; and
    exposing the wafer to oxidation conditions which are effective to oxidize at least some of the nitride-containing layer.

27. A method of forming integrated circuitry comprising:
providing a semiconductor wafer having front and back surfaces;
forming integrated circuitry over at least one of the front and back surfaces;
forming a hole within the wafer which extends through the entirety of the wafer and from the at least one of the front and back surfaces over which the integrated circuitry is formed; and
filling the hole with integrated circuitry interconnect metal material which interconnects with the integrated circuitry, wherein the filling of the hole comprises:
    forming a first material within the hole; and
    replacing the first material with a second material which is different from the first material.

28. The method of claim 27, wherein:
the forming of the first material comprises chemical vapor depositing polysilicon within the hole; and
the replacing of the first material comprises:
forming a layer of metal-comprising material over the first material; and
annealing the wafer under conditions which are effective to cause the metal-comprising material to replace the first material.

29. A method of forming integrated circuitry comprising:
providing a semiconductive material wafer for supporting integrated circuitry, the wafer having a thickness;
removing an amount of semiconductive wafer material to provide a hole which extends entirely through the wafer;
forming integrated circuitry relative to the wafer; and
replacing removed semiconductive wafer material by forming a conductive metal-comprising material which interconnects with the integrated circuitry by:

filling the hole with a first material;
forming a layer comprising the metal-comprising material over the first material; and
subjecting the wafer to conditions effective to cause the metal-comprising material to replace the first material.

30. The method of claim 29, wherein the subjecting of the wafer comprises annealing the wafer at a temperature, and for a time sufficient to cause the metal-comprising material to replace the first material.

31. A method of forming integrated circuitry comprising:
providing a semiconductive material wafer having front and back surfaces and a wafer thickness between the surfaces;
removing an amount of semiconductive wafer material sufficient to form a hole which extends through the front and back surfaces and wafer thickness;
after removing the semiconductive wafer material, forming integrated circuitry over the front and back surfaces;
forming a first material within the hole;
forming a second material over the first material, the second material being electrically conductive; and
subjecting the wafer to processing conditions effective to replace the first material with the second material, the second material electrically interconnecting at least some front surface integrated circuitry with at least some back surface integrated circuitry.

32. The method of claim 31, wherein the forming of the first material comprises chemical vapor depositing polysilicon within the hole.

33. The method of claim 31, wherein:
the forming of the first material comprises chemical vapor depositing polysilicon within the hole; and
the forming of the second material comprises forming an aluminum-comprising material over the polysilicon.

34. The method of claim 31, wherein:
the forming of the first material comprises chemical vapor depositing polysilicon within the hole;
the forming of the second material comprises forming an aluminum-comprising material over the polysilicon; and
annealing the wafer at a temperature, and for a time sufficient to cause the aluminum-comprising material to replace the polysilicon.

35. The method of claim 31, wherein the removing of the amount of semiconductive wafer material comprises:
placing the wafer in a dipole ring magnetron reactor; and
exposing the wafer to conditions which are effective to form a hole through the wafer having an aspect ratio greater than 75.

* * * * *

UNITED STATES PATENT AND TRADEMARK OFFICE
CERTIFICATE OF CORRECTION

PATENT NO.    : 6,187,677 B1
DATED         : February 13, 2001
INVENTOR(S)   : Kie Y. Ahn Page 1 of 1

It is certified that error appears in the above-identified patent and that said Letters Patent is hereby corrected as shown below:

Column 1,
Line 66, after "at" insert -- a --.

Column 6,
Line 63, delete "it".

Signed and Sealed this

Twenty-third Day of October, 2001

Attest:

*Attesting Officer*

NICHOLAS P. GODICI
*Acting Director of the United States Patent and Trademark Office*